US010811219B2

(12) United States Patent
Shneyour et al.

(10) Patent No.: US 10,811,219 B2
(45) Date of Patent: Oct. 20, 2020

(54) METHOD FOR EVALUATING A REGION OF AN OBJECT

(71) Applicant: APPLIED MATERIALS ISRAEL LTD., Rehovot (IL)

(72) Inventors: Ofer Shneyour, Tel Aviv-Jaffa (IL); Ron Naftali, Shoham (IL); Ronnie Porat, Nes-Ziona (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 16/057,762

(22) Filed: Aug. 7, 2018

(65) Prior Publication Data
US 2020/0051777 A1 Feb. 13, 2020

(51) Int. Cl.
*H01J 37/28* (2006.01)
*H01J 37/22* (2006.01)
*H01J 37/305* (2006.01)

(52) U.S. Cl.
CPC ............ *H01J 37/222* (2013.01); *H01J 37/28* (2013.01); *H01J 37/305* (2013.01); *H01J 2237/221* (2013.01); *H01J 2237/2448* (2013.01); *H01J 2237/24475* (2013.01)

(58) Field of Classification Search
CPC ........ H01J 37/222; H01J 37/305; H01J 37/28; H01J 2237/221; H01J 2237/24475; H01J 2237/2448
USPC .................................. 250/306, 307, 310, 311
See application file for complete search history.

(56) References Cited

U.S. PATENT DOCUMENTS

| 6,670,610 | B2 * | 12/2003 | Shemesh | ............... H01J 37/304 850/9 |
| 7,468,506 | B2 * | 12/2008 | Rogers | ............... G01N 21/8851 250/234 |
| 9,064,811 | B2 | 6/2015 | Rue et al. | |
| 9,881,766 | B2 * | 1/2018 | Buxbaum | ............... G01N 1/32 |
| 2006/0011868 | A1 | 1/2006 | Kidron et al. | |
| 2009/0296073 | A1 * | 12/2009 | Wagganer | .......... G01N 23/2202 356/72 |
| 2013/0248708 | A1 * | 9/2013 | Man | .................... G01N 23/2202 250/307 |

(Continued)

FOREIGN PATENT DOCUMENTS

KR 20150077234 A 7/2015
KR 101637332 B1 7/2016

OTHER PUBLICATIONS

PCT/US2019/043718, "International Search Report and Written Opinion", dated Nov. 15, 2019, 13 pages.

*Primary Examiner* — Michael Maskell
(74) *Attorney, Agent, or Firm* — Kilpatrick Townsend & Stockton LLP

(57) ABSTRACT

A method for evaluating a region of an object, the method may include repeating, for each sub-region out of a first sub-region of the region till a penultimate sub-region of the region, the steps of: (a) acquiring, by a charged particle imager, a charged particle image of the sub-region; and (b) milling, by a charged particle miller, the sub-region to expose another sub-region of region; acquiring, by the charged particle imager, a charged particle image of a last sub-region of the region; and generating three-dimensional information about a content of the region based on charge particle images of the first sub-region till last sub-region of the region.

20 Claims, 7 Drawing Sheets

(56) References Cited

U.S. PATENT DOCUMENTS

2014/0092230 A1\* 4/2014 Langer ............... G01N 23/2251
                                                      348/80
2015/0357159 A1   12/2015 Stone et al.
2016/0204041 A1   7/2016 Kim et al.

\* cited by examiner

210

220

METHOD FOR EVALUATING A REGION OF AN OBJECT

BACKGROUND OF THE INVENTION

Planar flash memory arrays are gradually being replaced by three-dimensional flash memory arrays that include multiple layers of flash memory cells. The vertical NAND memory array (V-NAND) is one of the most popular three-dimensional flash memory arrays. A V-NAND includes multiple layers (for example 48 layers in some instances) of flash memory cells.

There is a growing need to provide efficient methods, systems and computer program products for inspecting three-dimensional objects, such as but not limited to, V-NANDs.

SUMMARY

Some embodiments of the invention provide a method for evaluating a region of an object. The method can include repeating, for each sub-region out of a first sub-region of the region until a penultimate sub-region of the region, the steps of: (a) acquiring, by a charged particle imager, a charged particle image of the sub-region; and (b) milling, by a charged particle miller, the sub-region to expose another sub-region of region; acquiring, by the charged particle imager, a charged particle image of a last sub-region of the region; and generating three-dimensional information about a content of the region based on charge particle images of the first sub-region till last sub-region of the region.

Some embodiments pertain to a computer program product that stores instructions that stores instructions for evaluating a region of an object by repeating, for each sub-region out of a first sub-region of the region till a penultimate sub-region of the region, the steps of:
(a) acquiring, by a charged particle imager, a charged particle image of the sub-region; and
(b) milling, by a charged particle miller, the sub-region to expose another sub-region of region; acquiring, by the charged particle imager, a charged particle image of a last sub-region of the region; and generating three-dimensional information about a content of the region based on charge particle images of the first sub-region till last sub-region of the region.

BRIEF DESCRIPTION OF THE DRAWINGS

The subject matter regarded as the invention is particularly pointed out and distinctly claimed in the concluding portion of the specification. The invention, however, both as to organization and method of operation, together with specimens, features, and advantages thereof, may best be understood by reference to the following detailed description when read with the accompanying drawings in which:

Figure 1:
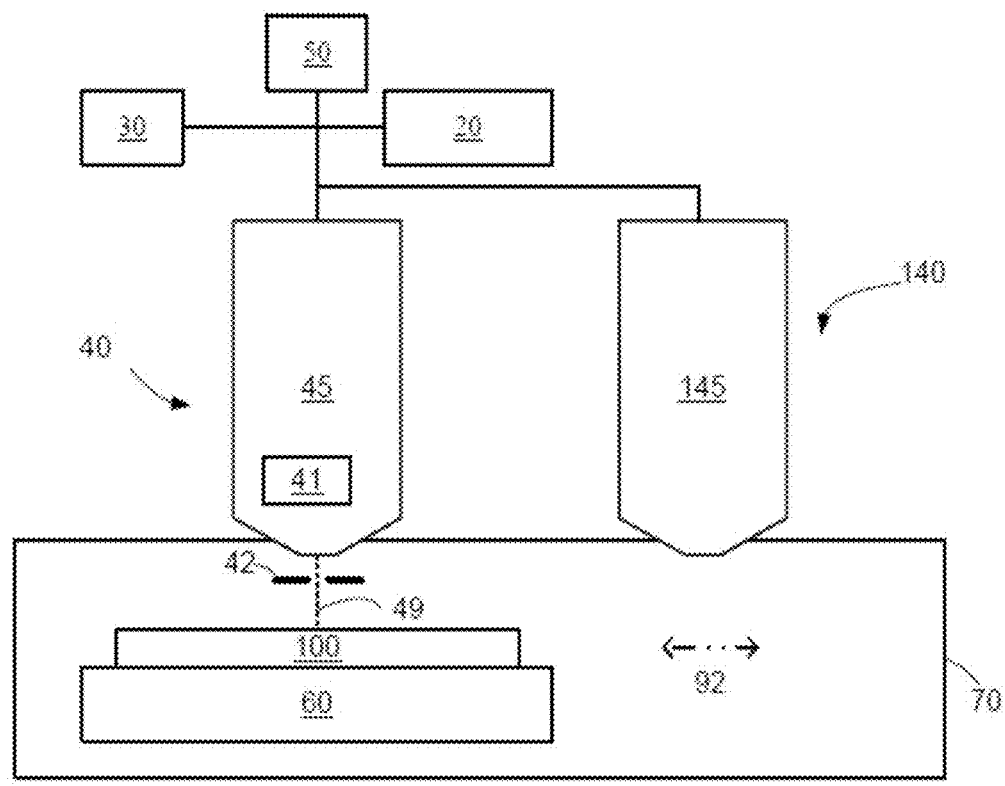
FIG. 1 illustrates an example of a system and an object according to the present disclosure.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a computer program product that stores instructions that once executed result in the execution of the method.

Any reference in the specification to a system should be applied mutatis mutandis to a method that may be executed by the system should be applied mutatis mutandis to a computer program product that stores instructions that can be executed by the system.

Any reference in the specification to a computer program product should be applied mutatis mutandis to a method that may be executed when executing instructions stored in the computer program product and should be applied mutandis to a system that is configured to executing instructions stored in the computer program product.

In the specification and drawings various examples refer to a three-dimensional flash memory array. It should be noted that the three-dimensional flash memory array is an example of an object.

Figure 2:
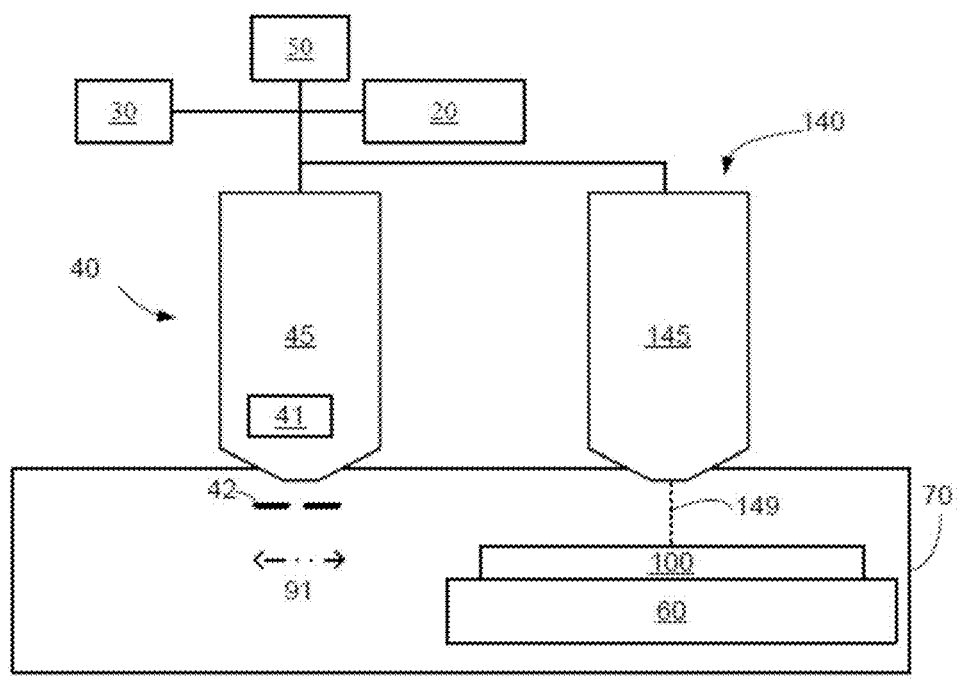
FIG. 2 illustrates an example of a system and an object according to the present disclosure.

FIGS. 1 and 2 illustrate example of a system 11 and of an object 100. System 11 may include charged particle imager 40, charged particle miller 140, chamber 70, mechanical stage 60, controller 20, processor 30 and memory unit 50. Charged particle imager 40 includes charged particle imager chamber 45 and one or more sensors. Charged particle miller 140 includes charged particle miller chamber 145 and one or more sensors (not shown).

A charged particle imager is a device that is configured to generate an image by illuminating an object with a charged particle beam, detecting particles emitted due to the illumination, and generate charged particle images based on the detection of the particles. An example of a charged particle imager is a scanning electron microscope.

A charged particle miller is a device that is configured to mill an object by irradiating an object with one or more charged particle beams. An example of a charged particle miller is a focused ion beam device.

The chamber 70 can be a vacuum chamber. The controller 20 can be configured to control the operation of system 11. The processor 30 can be configured to generate charged particle images based on detection signals from charged particle imager 40—especially from sensors such as in-lens sensor 41 and out-of-lens sensor 42 of charged particle imager 40. The in-lens sensor 41 is located within charged particle imager chamber 45 while the out-of-lens sensor 42 is positioned outside the charged particle imager chamber 45. The charged particle imager 40 can include any combination of sensors.

The mechanical stage 60 can be configured to move the object between the field of view 91 of the charged particle imager 40 and the field of view 92 of the charged particle miller 140.

In FIG. 1 the object 100 is positioned by mechanical stage 60 within the field of view 91 of the charged particle imager 40—and outside the field of view 92 of the charged particle miller 140. The charged particle imager 40 irradiates the object by one or more charged particle beams—such as primary electron beam 49.

In FIG. 2 the object 100 is positioned by mechanical stage 60 within the field of view 92 of the charged particle miller 140—and outside the field of view 91 of the charged particle imager 14. The charged particle miller 140 irradiates the object by one or more charged particle beams—such as primary ion beam 149.

In FIGS. 1 and 2 field of view 91 of the charged particle imager 40 and field of view 92 of the charged particle miller 140 do not overlap.

The charged particle imager 40 and the charged particle miller 140 are parallel to each other in FIGS. 1 and 2. An example of a system that includes a charged particle imager and a charged particle miller that are parallel to each other is illustrated in U.S. Pat. No. 6,670,610, which is incorporated herein by reference for all purposes.

Figure 3:
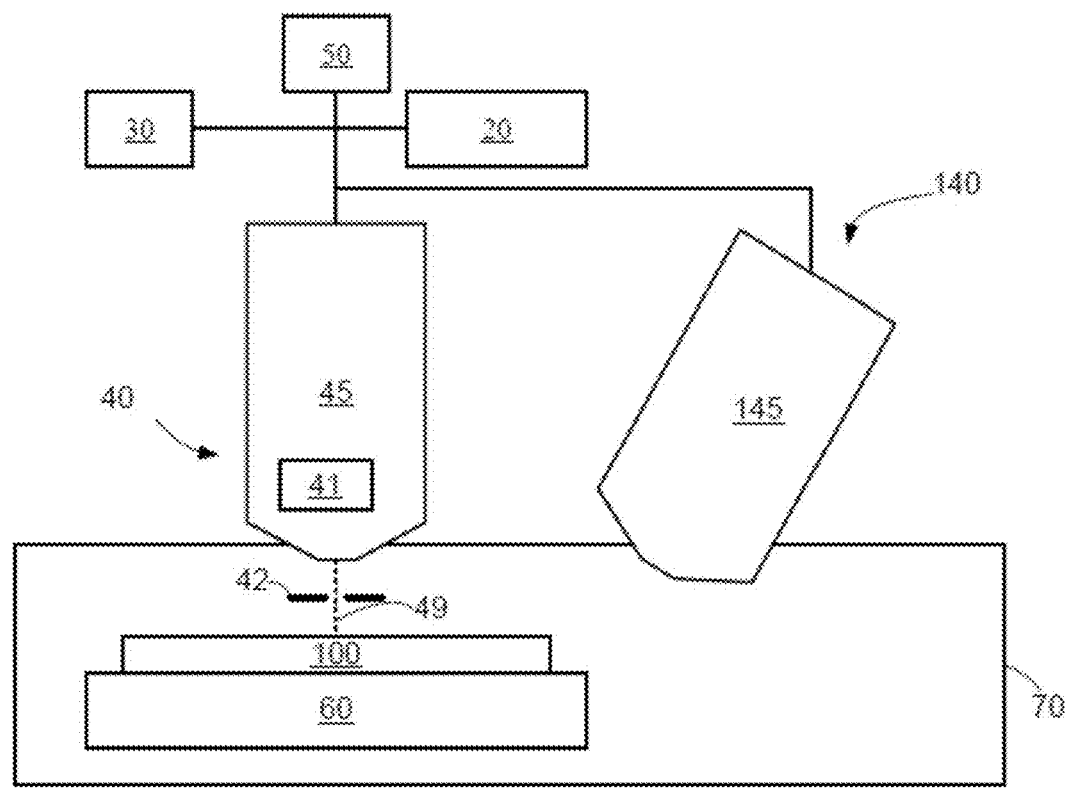
FIG. 3 illustrates an example of a system and an object according to the present disclosure.

FIG. 3 illustrates an example of a system 12 and of an object 100. System 12 may include charged particle imager 40, charged particle miller 140, chamber 70, mechanical stage 60, controller 20, processor 30 and memory unit 50.

Charged particle imager 40 includes charged particle imager chamber 45 and one or more sensors. Charged particle miller 140 includes charged particle miller chamber 145 and one or more sensors (not shown).

In system 12 the charged particle imager 40 and the charged particle miller 140 are oriented (nonparallel) to each other. Especially—while primary electron beam 49 is normal to object 100—primary ion beam 149 is not normal to object 100. The orientation of the charged particle miller 140 eases a milling of an object in an oriented manner. See, for example, FIGS. 6 and 7.

In FIG. 3 the field of view of the charged particle imager 40 does not overlap with the field of view 92 of the charged particle miller. An example of a system that includes a charged particle imager and a charged particle miller that are nonparallel to each other is illustrated in U.S. Pat. No. 6,670,610, which is incorporated herein by reference for all purposes.

Figure 4:
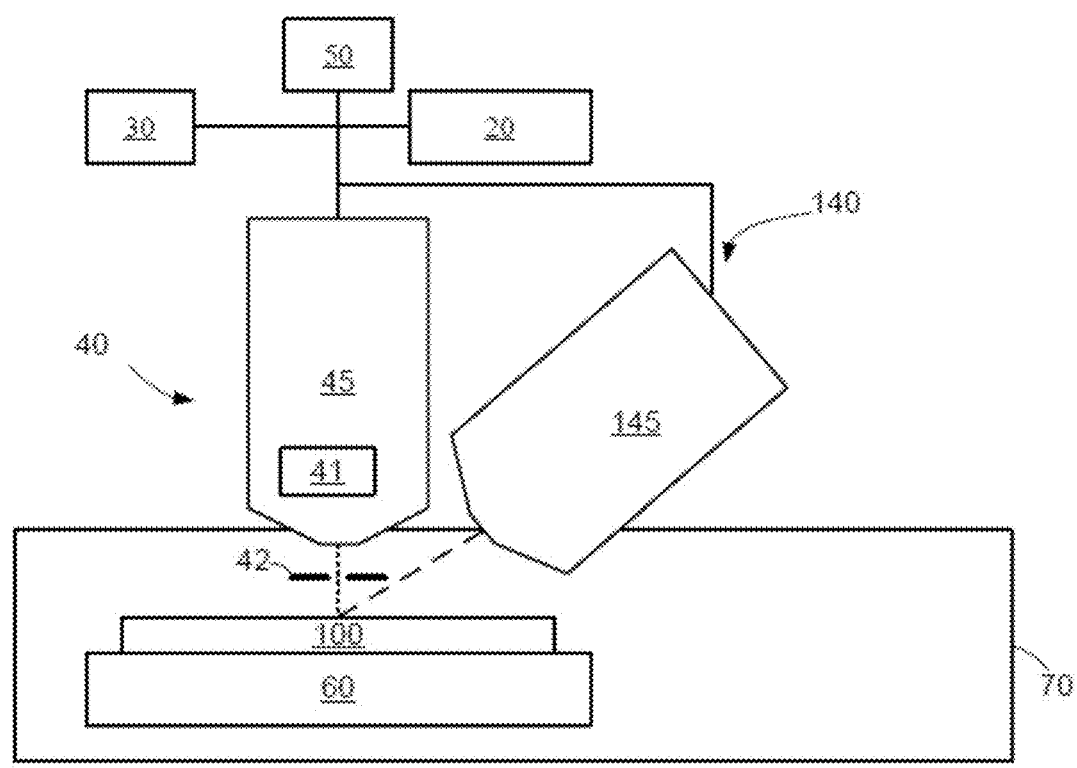
FIG. 4 illustrates an example of a system and an object according to the present disclosure.

FIG. 4 illustrates an example of a system 13 and of an object 100. System 13 may include charged particle imager 40, charged particle miller 140, chamber 70, mechanical stage 60, controller 20, processor 30 and memory unit 50. Charged particle imager 40 includes charged particle imager chamber 45 and one or more sensors. Charged particle miller 140 includes charged particle miller chamber 145 and one or more sensors (not shown).

In system 13 the charged particle imager 40 and the charged particle miller 140 are oriented (nonparallel) to each other. Especially—while primary electron beam 49 is normal to object 100—primary ion beam 149 is not normal to object 100. The orientation of the charged particle miller 140 eases a milling of an object in an oriented manner. See, for example, FIGS. 6 and 7.

Charged particle imager 40 includes charged particle imager chamber 45 and one or more sensors. Charged particle miller 140 includes charged particle miller chamber 145 and one or more sensors (not shown).

In FIG. 4 the field of view of the charged particle imager 40 at least partially overlaps the field of view 92 of the charged particle miller—and this may obviate the need to move the object between milling and imaging.

Figure 10:
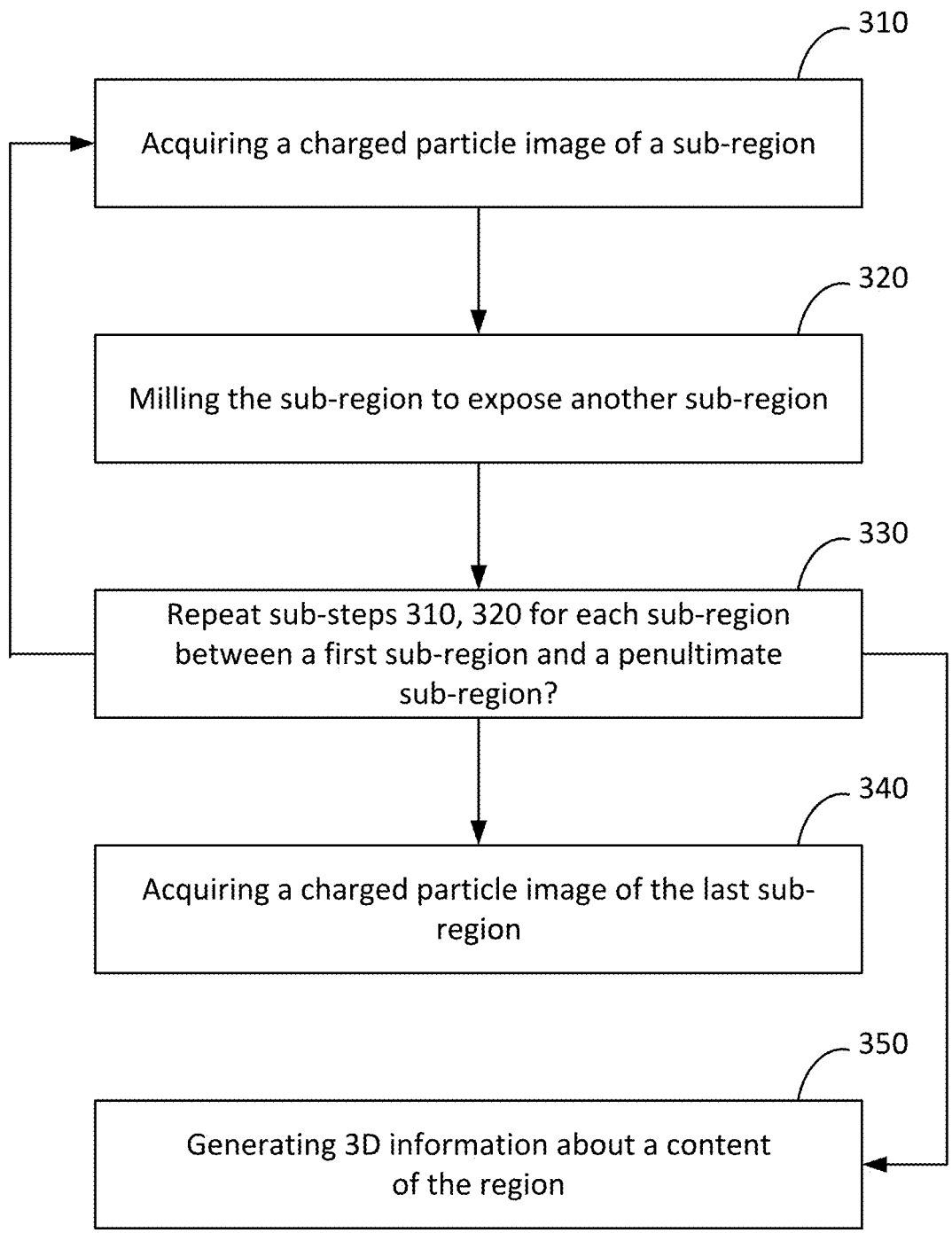
FIG. 10 illustrates an example of a method according to the present disclosure.

Each one of systems 11, 12 and 13 are configured to execute method 300 of FIG. 10.

It should be noted that while FIGS. 1,2,3 and 4 illustrates a single controller, a single processor and a single memory unit—the each one of systems 11, 12 and 13 may include more than a single controller, more than a single processor and more than a single memory unit. For example—a controller, processor and a memory unit may be allocated per each one of the charged particle imager 40 and the charged particle miller 140.

Figure 5:
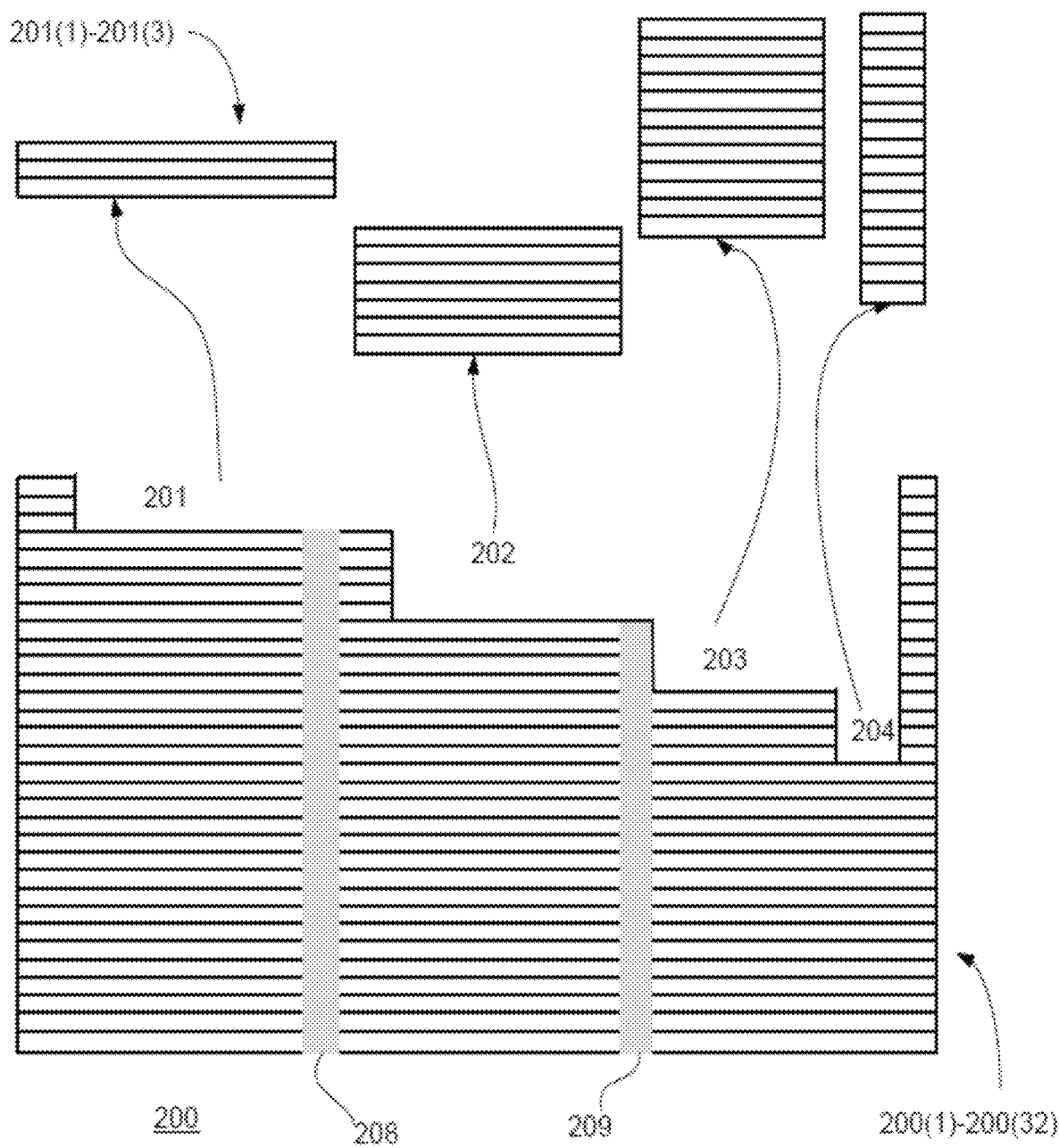
FIG. 5 illustrates an example of a partially milled three-dimensional flash memory array and of milled regions.

FIG. 5 illustrates an example of a partially milled three-dimensional flash memory array 200 and of milled regions. The three-dimensional flash memory array 200 includes thirty two layers 200(1)-200(32), first vertical gate structure 208 and second vertical gate structure 209. The number of layers may differ than thirty two. Adjacent layers may be visually distinguishable from each other.

FIG. 5 illustrates first region 201, second region 202, third region 203 and forth region 204. Each one of first region 201, second region 202, third region 203 and forth region 204 can be imaged by applying an iterative imaging and milling process. Method 300 of FIG. 10 is an example of an iterative imaging and milling process.

First region is illustrated as including first sub-region 201(1), second sub-region 201(2) and third sub-region 201(3). Second region 202 is narrower than first region 201. Second region 202 is also thicker than first region 201—and includes seven sub-regions. Third region 203 is narrower than second region 202. Third region 203 is also thicker than second region 202—and includes more sub-regions than second region 202. Forth region 204 is narrower than third region 203. Forth region 204 is also thicker than third region 203—and includes more sub-regions than third region 203.

The number of sub-regions per region, the number of regions, the shape of each region, and the size of each region may differ from those illustrated in FIG. 5.

In FIG. 5 each sub-region has a thickness that equals a thickness of a layer of three-dimensional flash memory array 200. It should be noted that one or more sub-region may have a different thickness that a thickness of a layer of three-dimensional flash memory array 200.

Figure 6:
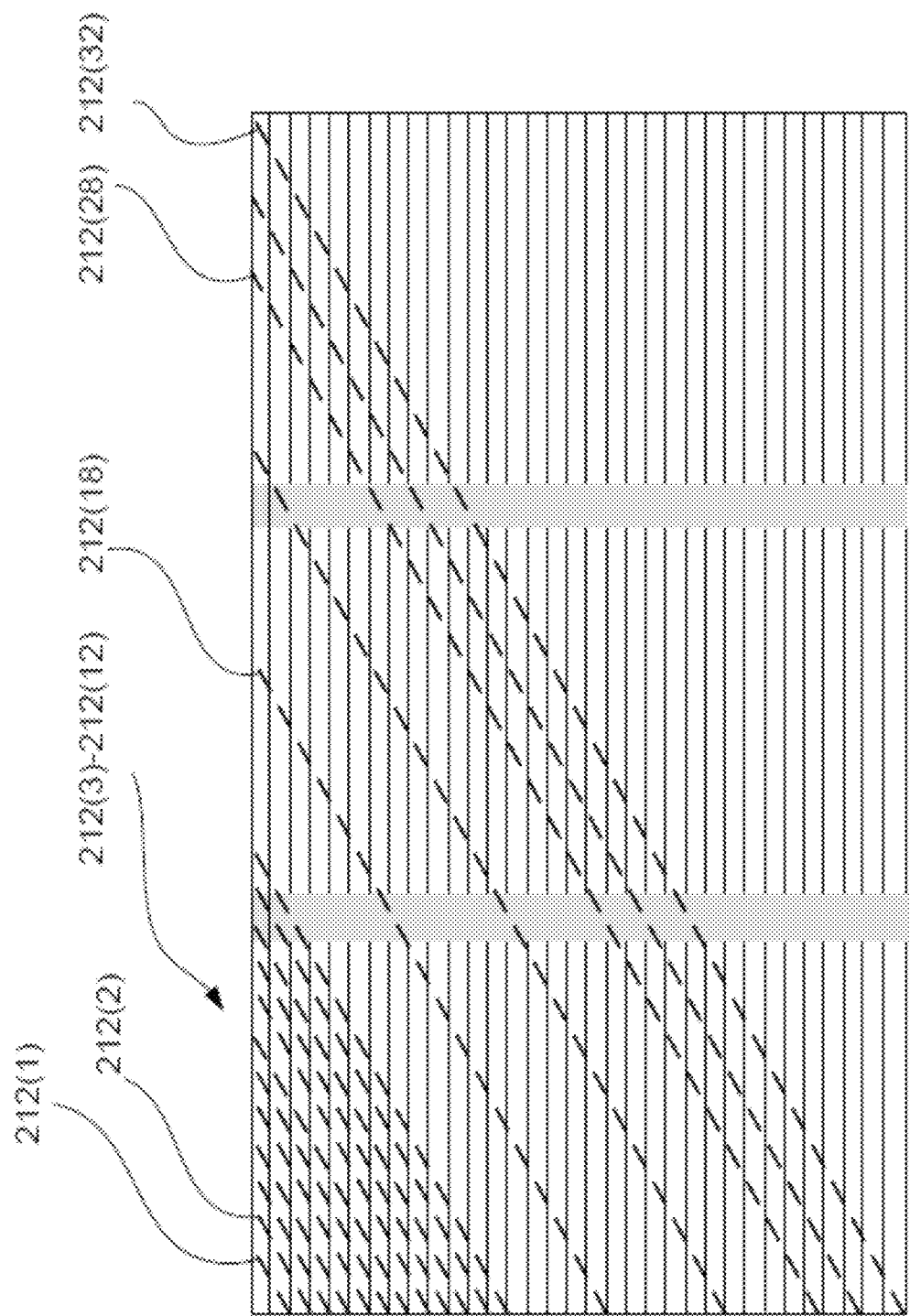
FIG. 6 illustrates an example of a partially milled three-dimensional flash memory array and of milling planes.
Figure 7:
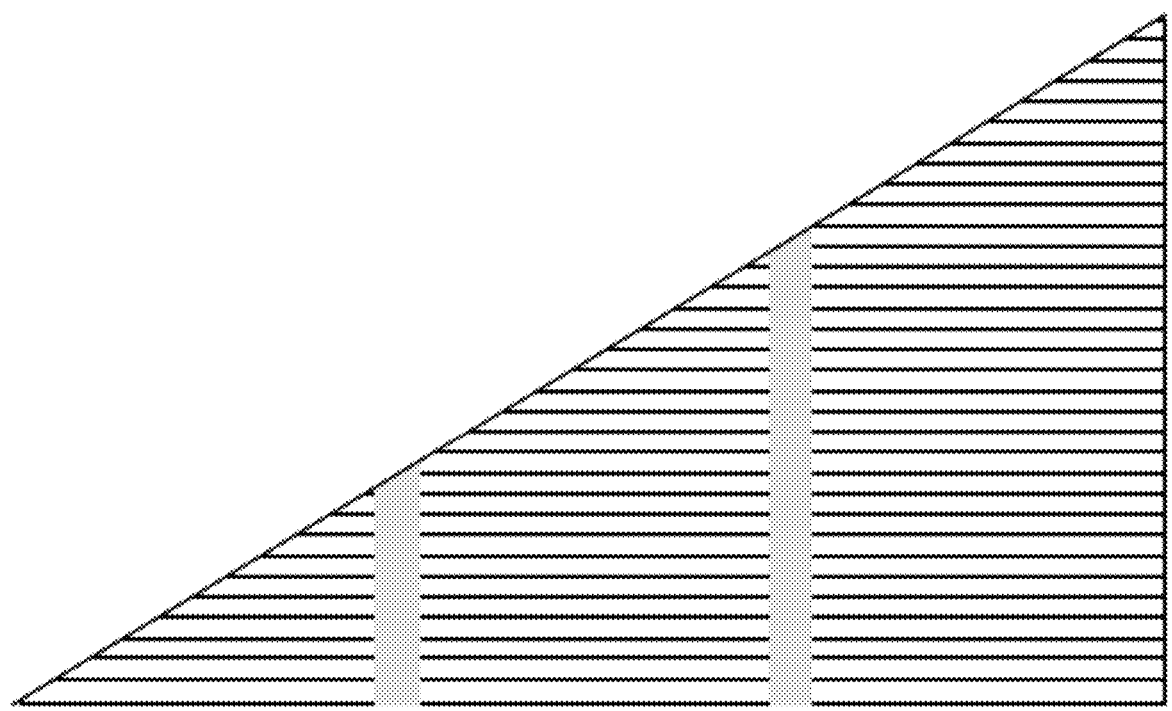
FIG. 7 illustrates an example of a partially milled three-dimensional flash memory array.

FIG. 6 illustrates an example of a partially milled three-dimensional flash memory array and of milling planes. FIG. 7 illustrates an example of a partially milled three-dimensional flash memory array.

FIG. 6 illustrates various milling planes 212(1)-212(12), 212(12), 212(28) and 212(32). These milling planes are oriented (by more than zero degrees and by less than one hundred degrees) to the multiple layers of the three-dimensional flash memory array 210. A milling plane illustrates the outcome of a milling iteration. These milling planes define sub-sections that are oriented to the multiple layers of the three-dimensional flash memory array 210.

A sub-section may be defined by adjacent milling planes. A sub-section is exposed, images and then milled to expose another sub-region. Using milling planes that are non-parallel to the layer of the object allow to expose different parts of different layers simultaneously.

Figure 8:
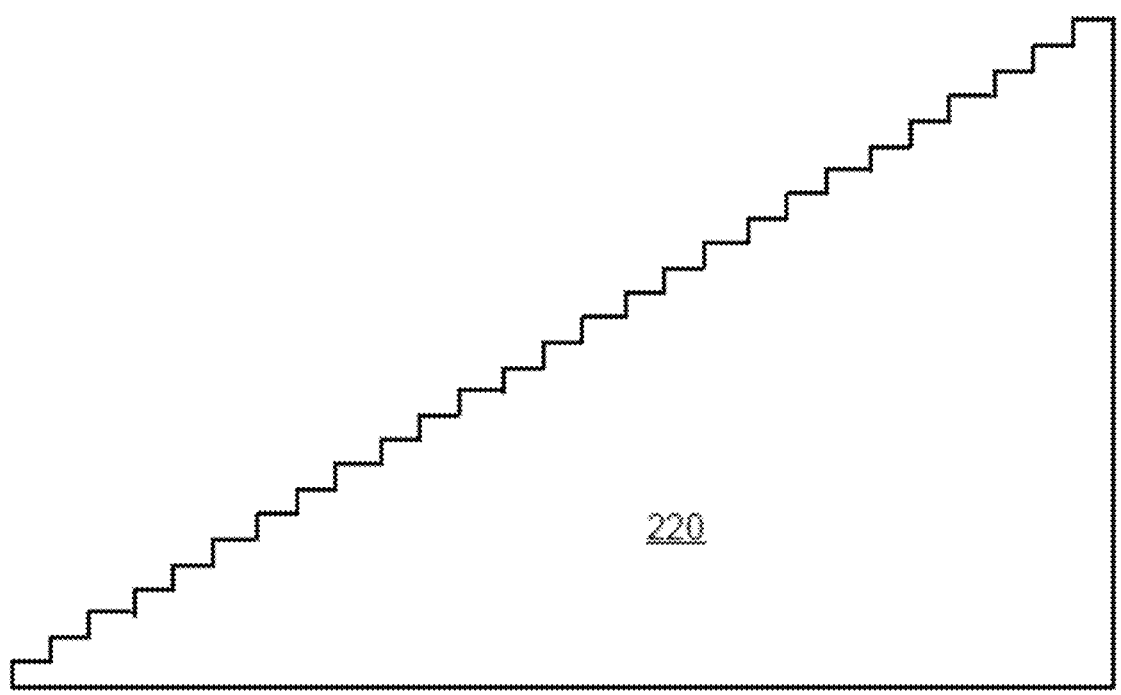
FIG. 8 illustrates an example of a partially milled three-dimensional flash memory array.

FIG. 8 illustrates an example of a partially milled three-dimensional flash memory array. In FIG. 8 the oriented milling planes are replaced by multiple steps.

Figure 9:
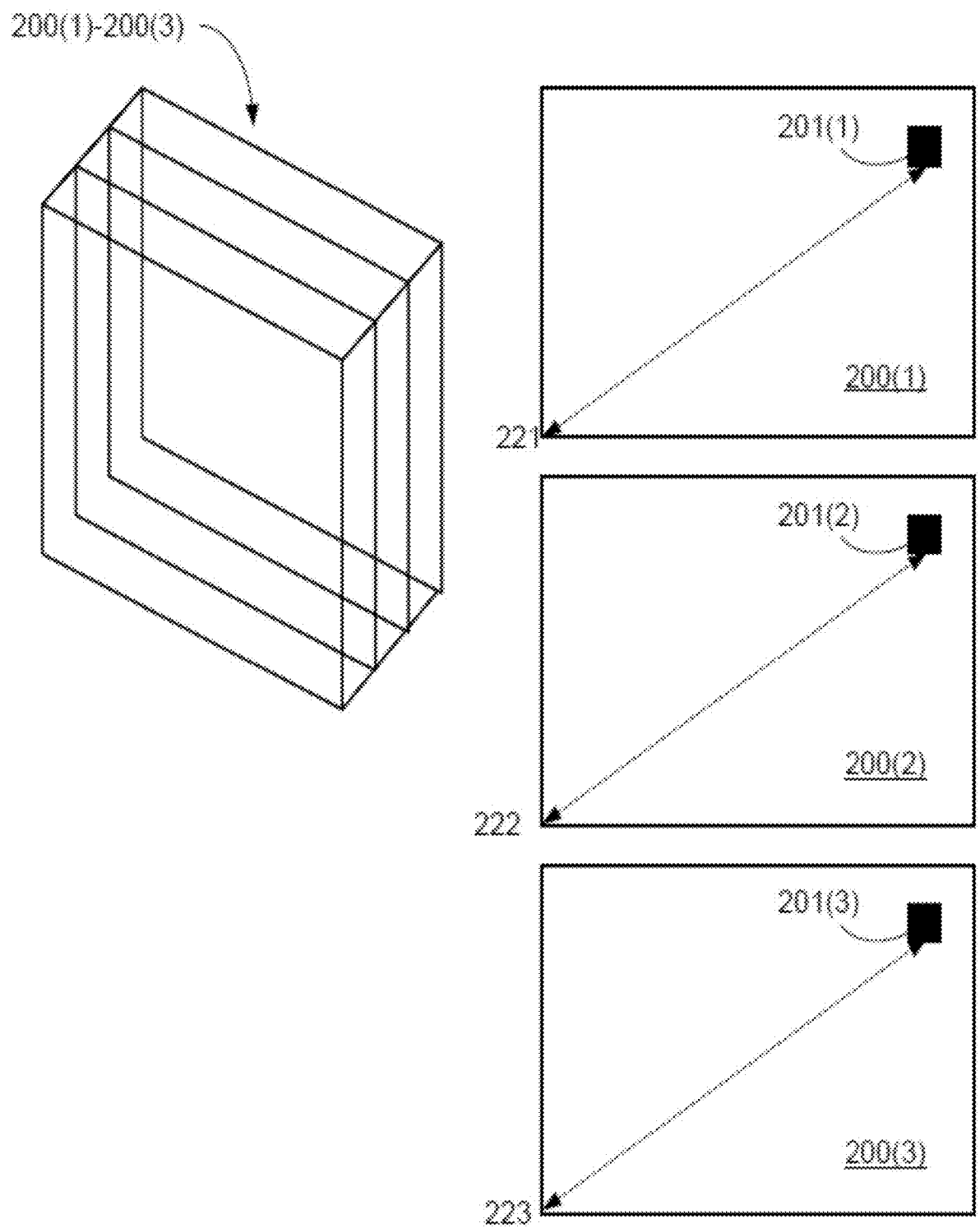
FIG. 9 illustrates an example of three layers of a three-dimensional flash memory array and of three regions.

FIG. 9 illustrates an example of first layer 200(1), second layer 200(2) and third layer 200(3) of three-dimensional flash memory array 200, and of first sub-region 201(1), second sub-region 201(2) and third sub-region 201(3).

During the an iterative imaging and milling process:
a. A charged particle image of first sub-region 201(1) is acquired.
b. The first sub-region 201(1) is removed by milling—thereby exposing second sub-region 201(2).
c. A charged particle image of second sub-region 201(2) is acquired.
d. The second sub-region 201(2) is removed by milling—thereby exposing third sub-region 201(3).
e. A charged particle image of third sub-region 201(3) is acquired.
f. Information about region 201 may be obtained by processing the charged particle images of first sub-region 201(1), second sub-region 201(2) and third sub-region 201(3).

After step (e) the third sub-region 201(3) may be removed by milling. When the iterative imaging and milling process is applied on three sub-regions the second sub-region is the penultimate sub-region.

FIG. 9 also illustrates a registration process. The left bottom corner of each one of first layer 200(1), second layer 200(2) and third layer 200(3) is used as a landmark for registration purposes. Before the milling starts—the location of the milled (or imaged) sub-region is calculated based on the known spatial relationship between the left bottom corner and the sub-region. Any other landmark may be used for registration. A landmark registration process is illustrated in U.S. Pat. No. 6,670,610, which is incorporated herein by reference.

FIG. 10 illustrates an example of method 300. Method 300 may start by step 310 of acquiring, by a charged particle imager, a charged particle image of a sub-region.

Step 310 may be followed by step 320 of milling, by a charged particle miller, the sub-region to expose another sub-region of region. Step 330 is a control step of checking whether steps 310 and 320 were repeated for each sub-region between a first sub-region of the region and a penultimate sub-region of the region.

If the answer is negative, then step 330 jumps to step 310 in which the newly exposed sub-region is imaged. If the answer is positive, then step 330 is followed by step 340 of acquiring, by the charged particle imager, a charged particle image of a last sub-region of the region.

Step 340 may be followed by milling (not shown), by a charged particle miller, the last sub-region.

Step 330 may also be followed by step 350 of generating three-dimensional information about a content of the region based on charge particle images of the first sub-region till last sub-region of the region.

Step 350 may be executed by a system that includes the charged particle miller, by a system that includes the charged particle imager, or by a system that does not include either one of the charged particle imager and the charged particle miller.

The sub-regions may be parallel to multiple layers of the object (see, for example FIG. 5) or may be oriented (see, for example FIGS. 6 and 7) in relation to the multiple layers of the object.

Each one of steps 310 and 340 may include illuminating the sub-region with a charged particle beam that has an interaction depth that may equal the depth of the sub-region or may exceed the depth of the sub-region.

Each one of steps 310 and 340 may include (or may be preceded by) performing a registration between the sub-region and a previously milled sub-region. See, for example, FIG. 9).

Method 300 may include moving the object between a first location in which the object is accessible to the charged particle imager and out of a field of view of the charge particle miller to a second location in which the object is accessible to the charged particle miller and is out a field of view of the charged particle imager. The movement may occur between steps 310 and 320. An opposite step may occur between step 320 and 310.

Method 300 may include at least one of the following steps:
g. Milling by inducing a selective etch decoration gas (such as XeF2) to enhance milling contrast
h. Milling by inducing gas to enhance milling uniformity during milling.
i. Detection of milling depth end point or detection of milling depth by analyzing acquired images (sensed by one or more sensors of the charged particle miller) in real time.
j. Variation of ion acceleration voltage during the milling of a region, starting with high acceleration voltage for high material removal rate, and finish with a low acceleration voltage for improved milled surface quality.

Method 300 may be applied for evaluating more than a single region. The milling and imaging of sub-regions of different regions may be executed in a serial manner, in a parallel manner, in an interchangeable manner or any other manner.

FIG. 5 illustrates first region 201, second region 202, third region 203 and forth region 204 that may be evaluated using one or more repetitions of method 300.

Method 300 may include applying steps 310, 320, 330 and 340 for each one out of multiple regions. This may amount to repeating, for each sub-region out of a first sub-region of an additional region till a penultimate sub-region of the additional region, the steps of:
k. Acquiring, by a charged particle imager, a charged particle image of the sub-region.
l. Milling, by a charged particle miller, the sub-region to expose another sub-region of region; acquiring, by the charged particle imager, a charged particle image of a last sub-region of the additional region.
m. Generating three-dimensional information about a content of the additional region based on charge particle images of the first sub-region till last sub-region of the additional region.

The region and the additional region may differ from each other by depth. The region and the additional region may differ from each other by a number of layers.

The charged particle image of each sub-region may be a backscattered electron image of the sub-region, a secondary electron image of the sub-region, or a combination of a secondary electron image of the sub-region and of a backscattered electron image of the sub-region.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also, for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for evaluating an object with a tool having a charged particle imager and a charged particle miller, the method comprising:
applying an iterative imaging and milling process to a region of the object having a plurality of vertically stacked layers formed thereon, the iterative imaging and milling process comprising:
(a) acquiring, by the charged particle imager, a charged particle image of a first sub-region of the region;
(b) milling, by the charged particle miller and along a milling plane oriented non-parallel to the plurality of vertically stacked formed on the object, the sub-region to expose another sub-region of the region directly below the milled first sub-region; and
(c) repeating the acquiring and milling steps for each of a plurality of sub-regions below the first sub-region of the region until a penultimate sub-region of the region;
acquiring, by the charged particle imager, a charged particle image of a last sub-region of the region directly below the penultimate sub-region; and
generating three-dimensional information about a content of the region based on charge particle images of the first sub-region through the last sub-region of the region.

2. The method according to claim 1 wherein each sub-region in the first through last sub-regions comprises a layer from the plurality of vertically stacked layers of the object.

3. The method according to claim 1 wherein the sub-regions are oriented in relation to the plurality of vertically stacked layers of the object.

4. The method according to claim 1 wherein the acquiring of the charged particle image of each sub-region of the region comprising illuminating the sub-region with a charged particle beam that has an interaction depth that exceeds a depth of the sub-region.

5. The method according to claim 1 wherein the acquiring of the charged particle image of each sub-region of the region is preceded by performing a registration between the sub-region and a previously milled sub-region.

6. The method according to claim 1 wherein the acquiring of the charged particle image of each sub-region out of the first sub-region until the penultimate sub-region is followed by moving the object between a first location in which the object is accessible to the charged particle imager and out of a field of view of the charge particle miller to a second location in which the object is accessible to the charged particle miller and is out a field of view of the charged particle imager.

7. The method according to claim 1 further comprising:
repeating, for each sub-region out of a first sub-region of an additional region until a penultimate sub-region of the additional region, the steps of: (a) acquiring, by a charged particle imager, a charged particle image of the sub-region; and (b) milling, by a charged particle miller, the sub-region to expose another sub-region of region;
acquiring, by the charged particle imager, a charged particle image of a last sub-region of the additional region; and
generating three-dimensional information about a content of the additional region based on charge particle images of the first sub-region till last sub-region of the additional region.

8. The method according to claim 7 wherein the region and the additional region differ from each other by depth.

9. The method according to claim 7 wherein the region and the additional region differ from each other by a number of layers.

10. The method according to claim 1 wherein the charged particle imager is parallel to the charged particle miller.

11. The method according to claim 1 wherein the charged particle imager is oriented in relation to the charged particle miller.

12. The method according to claim 1 wherein the charged particle imager is a scanning electron microscope.

13. The method according to claim 1 wherein the charged particle image of each sub-region is a backscattered electron image of the sub-region.

14. The method according to claim 1 wherein the charged particle image of each sub-region is a secondary electron image of the sub-region.

15. The method according to claim 1 wherein the charged particle image of each sub-region is a combination of a secondary electron image of the sub-region and of a backscattered electron image of the sub-region.

16. A computer-readable memory product that stores instructions that, once executed by a computerized tool that includes a mechanical stage, a charged particle imager and a charged particle miller, cause the computerized tool to evaluate a region of an object having a plurality of vertically stacked layer formed thereon and positioned on the mechanical stage by performing the steps of:
(a) acquiring, by the charged particle imager, a charged particle image of a first sub-region of the region;
(b) milling, by the charged particle miller and along a milling plane oriented non-parallel to the plurality of vertically stacked formed on the object, the sub-region to expose another sub-region of the region directly below the milled first sub-region; and
(c) repeating the acquiring and milling steps for each of a plurality of sub-regions below the first sub-region of the region until a penultimate sub-region of the region;
acquiring, by the charged particle imager, a charged particle image of a last sub-region of the region directly below the penultimate sub-region; and
generating three-dimensional information about a content of the region based on charge particle images of the first sub-region till last sub-region of the region.

17. The method according to claim 1 wherein the charged particle imager is a scanning electron microscope and the charged particle miller is a focused ion beam device.

18. The method according to claim 17 wherein each sub-region in the first through last sub-regions comprises a layer from the plurality of vertically stacked layers of the object.

19. The method according to claim 17 wherein the object is positioned on a mechanical stage and disposed in a vacuum chamber and wherein the charged particle imager and the charged particle miller direct beams of electrons and ions, respectively, into the chamber towards the region of the object having a plurality of vertically stacked layers formed thereon.

20. The method according to claim 1 wherein milling by the charged particle miller is an angle diagonal to an upper surface of the object.

* * * * *